(12) United States Patent
Kwak et al.

(10) Patent No.: US 10,971,671 B2
(45) Date of Patent: Apr. 6, 2021

(54) THERMOELECTRIC CONVERSION MODULE AND VEHICLE INCLUDING THE SAME

(71) Applicants: Hyundai Motor Company, Seoul (KR); Kia Motors Corporation, Seoul (KR)

(72) Inventors: Jin Woo Kwak, Gyeongsan-si (KR); Kwang Min Choi, Seoul (KR); Byung-Wook Kim, Seongnam-si (KR); Hoo Dam Lee, Seongnam-si (KR); Ho Chan An, Hwaseong-si (KR); Jong Ho Seon, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/867,150

(22) Filed: May 5, 2020

(65) Prior Publication Data
US 2020/0266329 A1 Aug. 20, 2020

Related U.S. Application Data

(62) Division of application No. 16/124,757, filed on Sep. 7, 2018, now Pat. No. 10,686,114.

(30) Foreign Application Priority Data

Jun. 26, 2018 (KR) .................... 10-2018-0073364

(51) Int. Cl.
*H01L 35/12* (2006.01)
*H01L 35/10* (2006.01)
*F01N 5/02* (2006.01)
*H01L 35/32* (2006.01)

(52) U.S. Cl.
CPC .............. *H01L 35/32* (2013.01); *F01N 5/025* (2013.01); *H01L 35/10* (2013.01)

(58) Field of Classification Search
CPC .......... H01L 35/32; H01L 35/10; F01N 5/025
See application file for complete search history.

(56) References Cited

U.S. PATENT DOCUMENTS 3,070,644 A * 12/1962 Van Der Grinten .... H01L 35/32
136/230
2007/0084499 A1 * 4/2007 Dutta ...................... H01L 35/34
136/230

(Continued)

*Primary Examiner* — Jayne L Mershon
(74) *Attorney, Agent, or Firm* — Morgan, Lewis & Bockius LLP

(57) ABSTRACT

A thermoelectric conversion module may include a plurality of n type thermoelectric conversion materials and a plurality of p type thermoelectric conversion materials that are disposed alternately, and a plurality of electrodes that connects the plurality of thermoelectric conversion material disposed alternately on one side and on an opposite side alternately, wherein the plurality of electrodes includes a first electrode configured to electrically connect the n type thermoelectric conversion material and the p type thermoelectric conversion material by penetrating the n type thermoelectric conversion material and the p type thermoelectric conversion material to transfer heat obtained from a heat source to the plurality of thermoelectric conversion materials.

2 Claims, 6 Drawing Sheets

(56) References Cited

U.S. PATENT DOCUMENTS

| | | | | |
|---|---|---|---|---|
| 2009/0126772 A1* | 5/2009 | Machida | ............... | F25B 21/02 |
| | | | | 136/222 |
| 2011/0290293 A1* | 12/2011 | Kim | ..................... | H01L 35/08 |
| | | | | 136/200 |
| 2013/0061605 A1* | 3/2013 | de Rochemont | ....... | H01L 35/04 |
| | | | | 62/3.5 |
| 2015/0034138 A1* | 2/2015 | Himmer | ................. | H01L 35/32 |
| | | | | 136/205 |
| 2016/0329476 A1* | 11/2016 | Uchiyama | ............... | H01L 35/30 |
| 2017/0288115 A1* | 10/2017 | Kwak | .................... | F01N 13/10 |

* cited by examiner

THERMOELECTRIC CONVERSION MODULE AND VEHICLE INCLUDING THE SAME

CROSS-REFERENCE TO RELATED APPLICATION

The present application is a Divisional of U.S. patent application Ser. No. 16/124,757, filed Sep. 7, 2018, which claims priority to Korean Patent Application No. 10-2018-0073364, filed on Jun. 26, 2018, in the Korean Intellectual Property Office, the entire contents of which applications are incorporated herein for all purposes by these references.

BACKGROUND OF THE INVENTION

Field of the Invention

The present invention relates to a thermoelectric conversion module and a vehicle including the same.

Description of Related Art

A thermoelectric module is used for a thermoelectric power generation system using a Seebeck effect of generating an electromotive force by use of a temperature difference between opposite surfaces thereof.

During thermoelectric power generation by the thermoelectric module, an output of the thermoelectric power generation may be enhanced by maintaining a temperature difference between a high temperature portion and a low temperature portion at a large value. As such, a heat transfer rate of heat from a heat source to a thermoelectric module greatly influences the output of the power generation.

An example of a field that utilizes thermoelectric power generation by use of the thermoelectric module may include use of waste heat of an exhaust system of a vehicle as a representative example.

Because the conventional thermoelectric module may include bonding elements of the thermoelectric module, such as a thermoelectric conversion material and electrodes, it has a poor durability, and as it is disposed in an exhaust system of a vehicle to be exposed to heat and vibration, the bonding surface thereof may be separated so that the power generation performance of the thermoelectric module may deteriorate or power generation may become impossible.

To overcome the problem, an improved structure for improving the durability of the thermoelectric module has been required.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a thermoelectric module to improve the durability of a thermoelectric module by improving a thermoelectric conversion material and a coupling structure of electrodes.

Various aspects of the present invention are directed to providing a thermoelectric module to improve the durability of a thermoelectric module and provide a structure for maintaining or improving a power generation performance of the thermoelectric module at the same time.

In accordance with an aspect of the present invention, there is provided a thermoelectric conversion module including a plurality of n type thermoelectric conversion materials and a plurality of p type thermoelectric conversion materials that are disposed alternately, and a plurality of electrodes that connects the plurality of thermoelectric conversion material disposed alternately on one side and on an opposite side alternately.

The plurality of electrodes may include a high temperature side electrode that electrically connects the corresponding n type thermoelectric conversion material and the corresponding p type thermoelectric conversion material to transfer heat obtained from a heat source to the plurality of thermoelectric conversion materials.

In accordance with another aspect of the present invention, there is provided a vehicle including a thermoelectric conversion module disposed in an exhaust pipe, through which exhaust gas flows, to generate electric power by use of heat of the exhaust gas, wherein the thermoelectric conversion module may include a plurality of n type thermoelectric conversion materials and a plurality of p type thermoelectric conversion materials that are disposed alternately, and a plurality of electrodes that connect the plurality of thermoelectric conversion materials disposed alternately on high temperature sides and low temperature sides of the plurality of thermoelectric conversion materials alternately.

The plurality of electrodes may include a high temperature side electrode configured to electrically connect the corresponding n type thermoelectric conversion material and the corresponding p type thermoelectric conversion material to transfer heat obtained from a heat source to the plurality of thermoelectric conversion materials.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
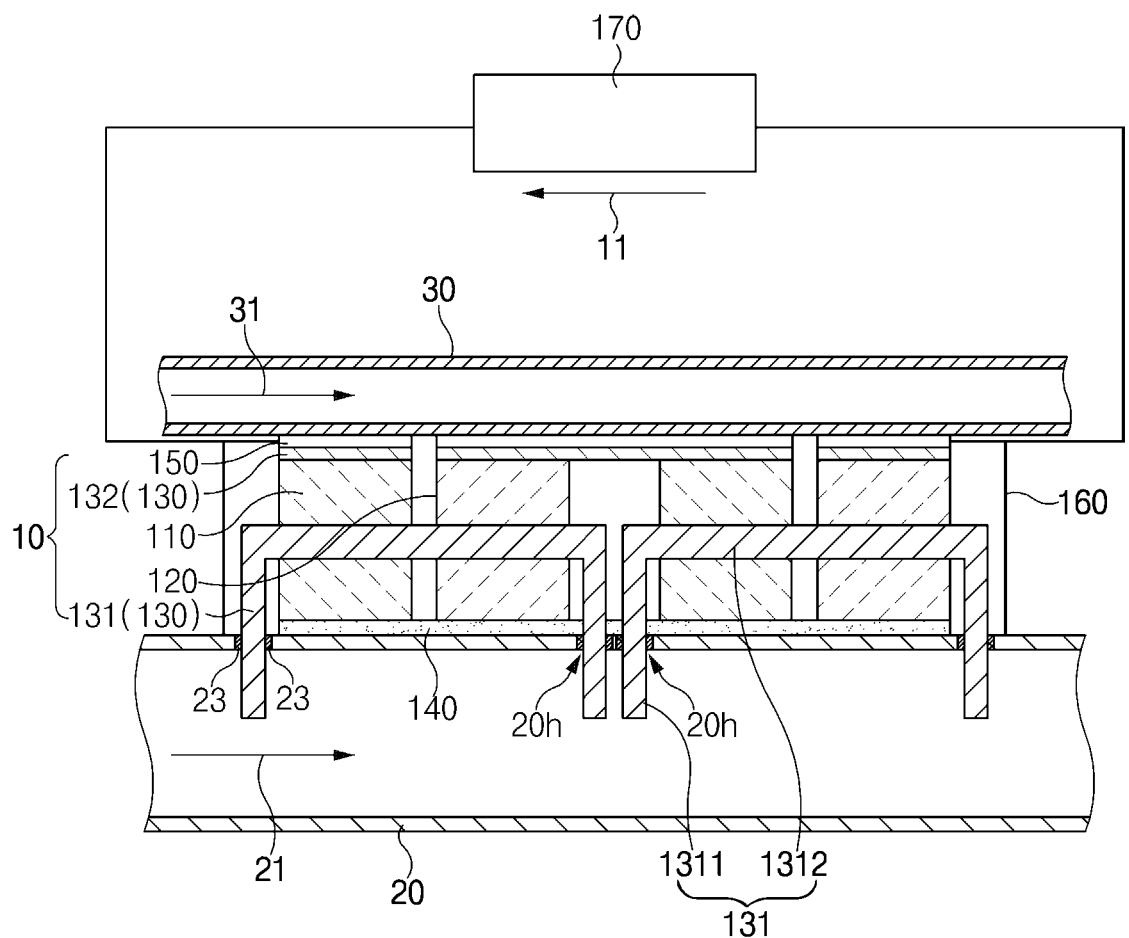
FIG. 1 is a conceptual view illustrating a thermoelectric conversion module according to an exemplary embodiment of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the contrary, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, various exemplary embodiments of the present invention will be described in detail with reference to the accompanying drawings. Throughout the specification, it is noted that the same or like reference numerals denote the same or like components even though they are provided in different drawings. Furthermore, in the following description of the present invention, a detailed description of known functions and configurations incorporated herein will be omitted when it may make the subject matter of the present invention rather unclear.

FIG. 1 is a conceptual view illustrating a thermoelectric conversion module according to an exemplary embodiment of the present invention.

The thermoelectric conversion module 10 according to the exemplary embodiment of the present invention includes a plurality of n type thermoelectric conversion materials 110 and a plurality of p type thermoelectric conversion materials 120 that are disposed alternately, and a plurality of electrodes 130 that alternately connect the plurality of alternately disposed thermoelectric conversion materials on a high temperature side and a low temperature side thereof.

The n type thermoelectric conversion materials 110 may include n type semiconductor devices.

The p type thermoelectric conversion materials 120 may include p type semiconductor devices.

The plurality of electrodes may be configured to electrically connect the n type thermoelectric conversion material 110 and the p type thermoelectric conversion materials 120 in series.

The plurality of electrodes 130 may include a high temperature side electrode 131 that electrically connects lower end portions (or high temperature side end portions) of the n type thermoelectric conversion materials 110 and lower end portions (or high temperature side end portions) of the p type thermoelectric conversion materials 120, and a low temperature side electrode 132 that electrically connects upper end portions (or lower side end portions) of the n type thermoelectric conversion materials 110 and upper end portions (or low temperature side end portions) of the p type thermoelectric conversion materials 120.

Meanwhile, it is more advantageous if a temperature difference of the high temperature parts and the low temperature parts of the thermoelectric conversion materials is larger to improve the power generation performance of the thermoelectric conversion module 10. For example, the thermoelectric conversion module 10 may be used to reduce the load of the battery of the vehicle by recycling heat of the exhaust gas of the vehicle. The thermoelectric conversion module disposed in the exhaust system of the vehicle is easily exposed to heat or vibration. Because the welding of the configurations of the conventional thermoelectric conversion module is not firm, in particular, the welding of the thermoelectric conversion materials and the electrodes may be easily separated by heat or vibration, the durability of the thermoelectric conversion module deteriorates and accordingly, the power generation performance of the thermoelectric conversion module deteriorates.

The thermoelectric conversion module 10 according to the exemplary embodiment is provided to solve the above-mentioned problems, and the present invention relates to a structure for improving the durability of the thermoelectric conversion module. In more detail, the basic feature of the present invention is that the thermoelectric conversion module 10 according to the exemplary embodiment of the present invention includes thermoelectric conversion materials 110 and 120, and electrodes that passes through the thermoelectric conversion materials 110 and 120 to make the coupling of the electrodes 130 firm.

The plurality of electrodes may pass through the n type thermoelectric conversion materials 110 and the p type thermoelectric conversion materials 120.

The electrodes that pass through the plurality of thermoelectric conversion materials 110 and 120 may be a high temperature side electrode 131 or a low temperature side electrode 132. Alternatively, the electrodes that pass through the plurality of thermoelectric conversion materials 110 and 120 may be both of a high temperature side electrode 131 and a low temperature side electrode 132.

Although it will be described below as an example that the high temperature side electrode 131 passes through the plurality of thermoelectric conversion materials 110 and 120, a configuration in which the low temperature side electrode 131 passes through the plurality of thermoelectric conversion materials 110 and 120 in the same or equivalent scheme also will be understood by an ordinary person in the art.

The thermoelectric conversion module 10 according to exemplary embodiments of the present invention may be disposed in an exhaust system of the vehicle to improve the fuel efficiency of the vehicle by generating electric power by use of heat of exhaust gas. That is, the thermoelectric conversion module may be configured such that the high temperature portion of the thermoelectric conversion module receives heat from the exhaust system, through which exhaust gas flows and the low temperature portion of the thermoelectric conversion module discharges heat to a refrigerant pipe, through which a refrigerant flows.

Here, although a vehicle that includes a combustion engine and discharges exhaust gas may be representatively exemplified, other vehicles that include a discharge hole, through which a fluid of high temperature is discharged will do good, and it will be understood by an ordinary person in the art that the thermoelectric conversion module 10 according to exemplary embodiments of the present invention may be disposed in the exhaust system of the vehicle to generate electric power.

Meanwhile, because the other configurations of the vehicle, such as a driving device, wheels, and a manipulation device are included by the prior inventions, a description thereof will be omitted.

The features of the thermoelectric conversion module 10 according to the exemplary embodiment will be described below in more detail.

Figure 2:
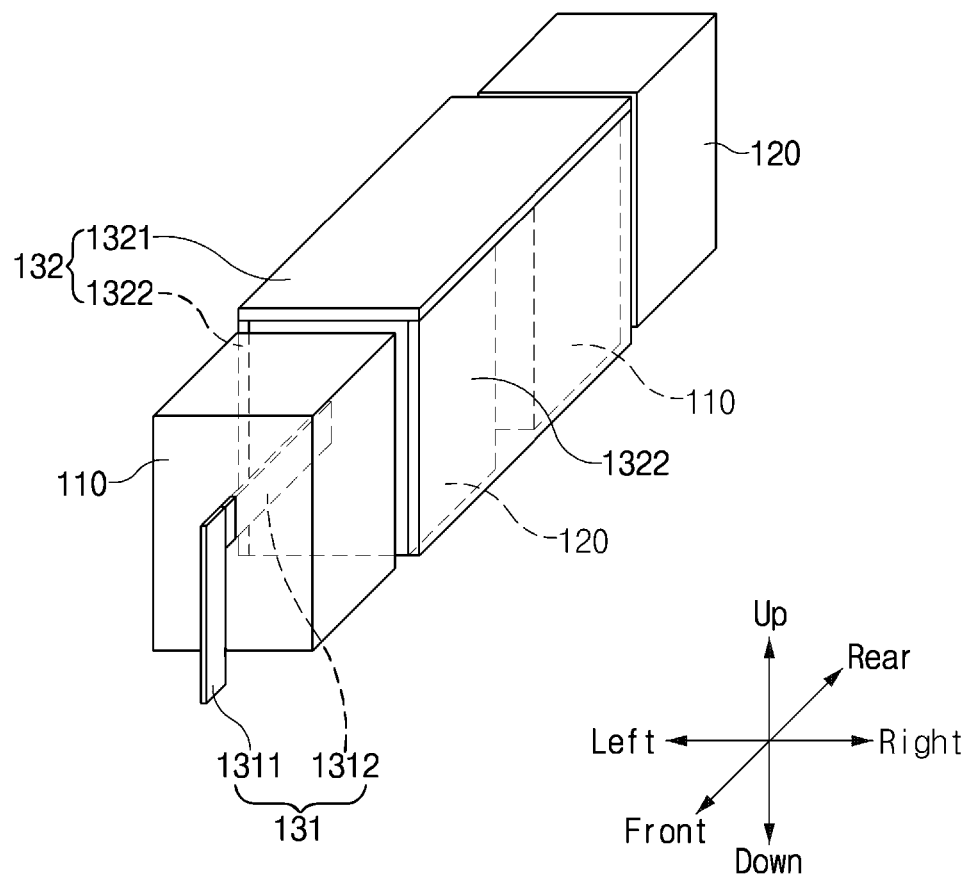
FIG. 2 is a perspective view of some configurations of the thermoelectric conversion module of FIG. 1.
Figure 3:
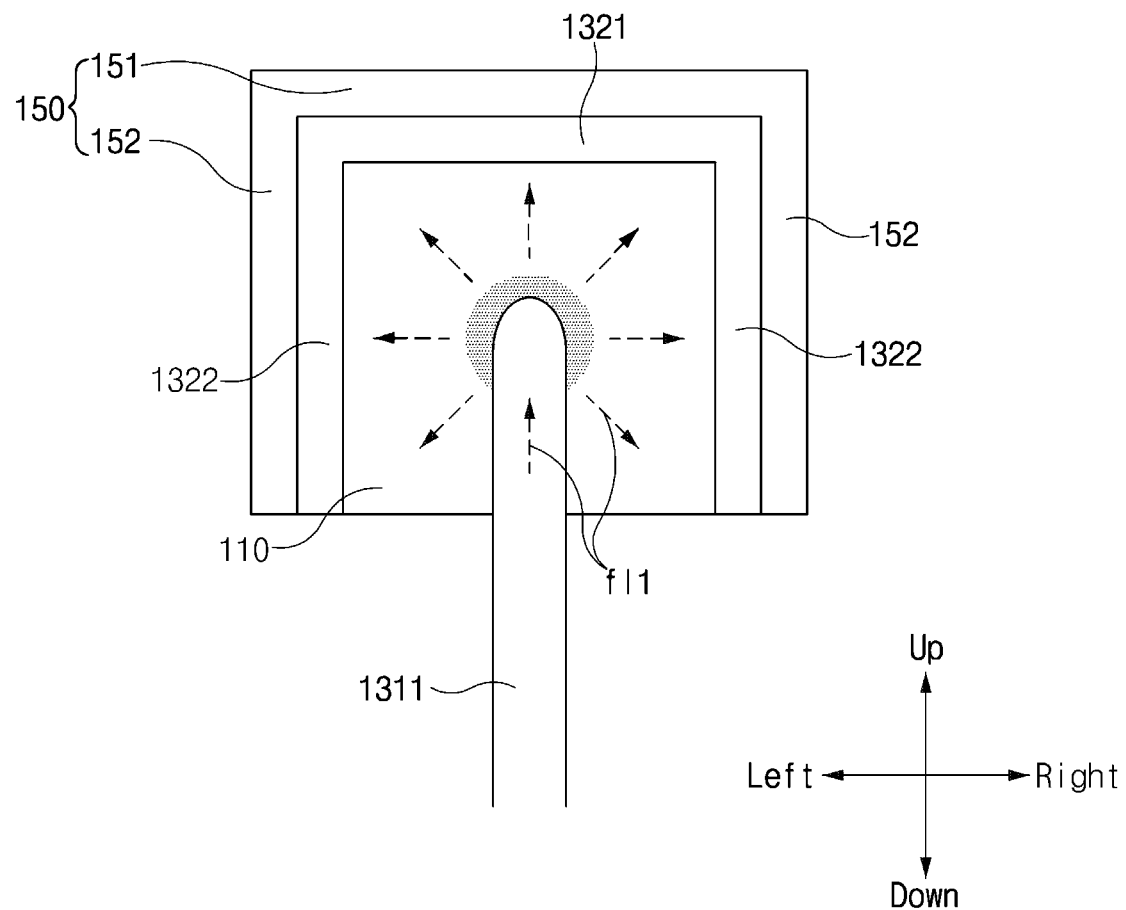
FIG. 3 is a view illustrating movement of heat in the thermoelectric conversion module of FIG. 1.
Figure 4:
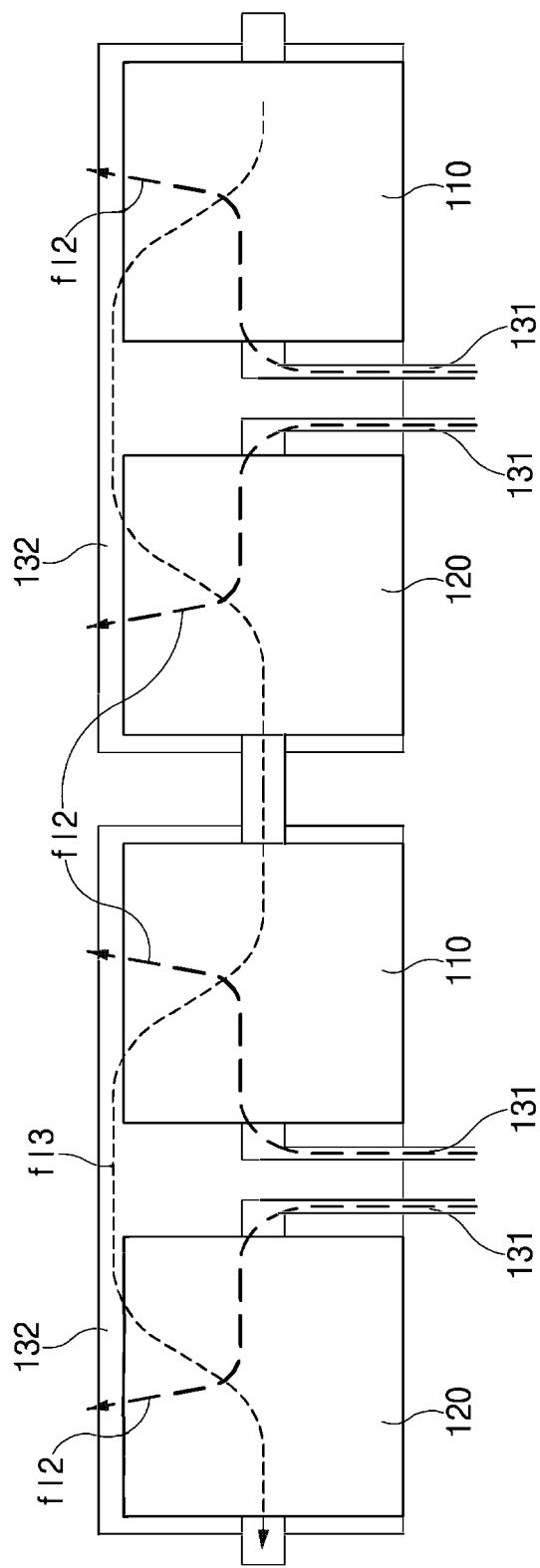
FIG. 4 is a view illustrating movement of heat and electrons in the thermoelectric conversion module of FIG. 1.

FIG. 2 is a perspective view of some configurations of the thermoelectric conversion module of FIG. 1. FIG. 3 is a view illustrating movement of heat and electrons in the thermoelectric conversion module of FIG. 1. FIG. 4 is a view illustrating movement of heat in the thermoelectric conversion module of FIG. 1.

Referring to FIG. 1, the high temperature side electrode 131 may pass through the n type thermoelectric conversion materials 110 and the p type thermoelectric conversion materials 120 that are adjacent to the high temperature side electrode 131.

The high temperature side electrode 131 may be of a band type or a wire type.

The high temperature side electrode 131 may include a thermoelectric portion 1311 which is inserted into a through-hole 20h formed in a high temperature passage pipe 20, and a through-portion 1312 that passes through the plurality of thermoelectric conversion materials 110 and 120. Through this, heat absorbed from a heat transfer fluid 21 may be linearly moved along the high temperature side electrode 131 and may be delivered to the thermoelectric conversion materials 110 and 112.

The thermoelectric portion 1311 of another high temperature side electrode 131 according to an exemplary embodiment of the present invention may protrude toward the high temperature passage pipe 20 with respect to the high temperature side end portions of the plurality of thermoelectric conversion materials 110 and 120 to be inserted into the through-hole 20h formed in the high temperature passage pipe 20, through which the heat transfer fluid flows, to acquire heat while directly contacting the heat transfer fluid 21 and to deliver the acquired heat to the plurality of thermoelectric conversion materials 110 and 120.

An insulation layer 23 for insulation from the high temperature side electrode 131 may be provided on an internal surface of the through-hole 20h. When the high temperature passage pipe 20 is formed of a conductor such as metal, because an electric current flows between the high temperature side electrode 131 and the high temperature passage pipe 20 when the high temperature passage pipe 20 contacts the high temperature side electrode 131, the performance of the thermoelectric conversion module may deteriorate. To prevent this, the insulation layer 23 may be provided at a portion of an internal surface of the through-hole 20h, which contacts the high temperature side electrode 131.

Meanwhile, although not illustrated, a portion of the high temperature side electrode 131, which contacts the high temperature passage pipe 20, may be insulation-coated. However, when a whole portion of the high temperature side electrode 131, which is inserted into the high temperature passage pipe 20, is insulation-coated, because the heat transfer from the heat transfer fluid 21 to the high temperature electrode 131 may decrease, the insulation coating is limited to a portion that contacts the high temperature passage pipe 20 (in the instant case, a margin of a specific length may be provided in consideration of a tolerance).

The high temperature side electrode 131 may include a through-portion 1312 that extends forwards and rearwards and a thermoelectric portion 1311 that extends upwards and downwards. The high temperature side electrode 131 may be formed such that a connecting portion of the thermoelectric portion 1311 and the through-portion 1312 is curved or bent.

A corner of a portion of the high temperature side electrode 131, at which the thermoelectric portion 1311 and the through-portion 1312 are connected to each other, may be rounded to prevent thermal stresses from being concentrated so that a property of the high temperature electrode 131 does change or the high temperature electrode 131 is not damaged.

The high temperature side electrode 131 may be configured that the thermoelectric portion 1311 is spaced from the thermoelectric conversion materials 110 and 120 by a specific distance to prevent the thermoelectric portion 1311 from contacting the thermoelectric conversion materials 110 and 112. According to the configuration, conduction of heat from the thermoelectric portion 1311 directly to the thermoelectric conversion materials 110 and 120 may be prevented, and heat transfer heat from the thermoelectric portion 1311 to the thermoelectric conversion materials 110 and 112 via the through-portion 1312 may be allowed.

A thermoelectric portion 1311 of another high temperature side electrode 131 according to an exemplary embodiment of the present invention may be of a plate type, and may have a shape that extends long upwards and downwards. When the electrode is curved or bent, thermal stresses are concentrated relatively at the curved or bent portion so that the electrode may be damaged at a relatively low temperature, and the thermoelectric portion 1311 of the high temperature side electrode 131 according to the exemplary embodiment extends long upwards and downwards in a plate type and may maintain its properties even at a relatively high temperature.

The high temperature side electrode 131 may be formed of a material, properties of which do not change due to oxidation or the like even though the high temperature side electrode 131 directly contacts exhaust gas.

For example, the high temperature side electrode 131 may be formed of an oxide-based thermoelectric conversion material. Because the oxide-based thermoelectric conversion material has an excellent thermal or electrically conductive property and is stable to oxidation at a high temperature, it may be used for the thermoelectric conversion module 10 of the exemplary embodiment that employs a scheme of directly contacting exhaust gas.

Referring to FIG. 2, the thermoelectric portion 1311 of the high temperature side electrode 131 may have a plate shape that extends forwards and rearwards thereof. Through this, when the thermoelectric portion 1311 is inserted into the high temperature passage pipe 20, a flow resistance applied to the heat transfer fluid 21 may be reduced.

Although not illustrated, to reduce a flow resistance to the heat transfer fluid 21, a through-hole may be formed at a portion of the high temperature side electrode 131, which is inserted into the high temperature passage pipe 20.

For example, a surface of the thermoelectric portion 1311 of the high temperature side electrode 131, which faces a flow direction of the heat transfer fluid 21 may have a specific thickness. The thermoelectric portion 1311 may have a through-hole on a surface of the thermoelectric portion 1311, which faces the flow direction of the heat transfer fluid 21.

A plurality of through-holes may be formed in the high temperature electrode 131 vertically and horizontally. The through-holes may have a circular shape or other various shapes.

Through this, a flow resistance applied to the heat transfer fluid 21 by the high temperature side electrode 131 inserted into the high temperature passage pipe 20 may be reduced, and heat may be efficiently transferred from the heat transfer fluid 21 to the high temperature side electrode 131. That is, because the heat transfer fluid 21 flows smoothly, the high temperature side electrode 131 may efficiently receive heat from the heat transfer fluid 21 of high temperature introduced from an upper side of the high temperature passage pipe 20.

The high temperature side electrode 131 may transfer the heat obtained from a heat source through the thermoelectric portion 1311 to the plurality of thermoelectric conversion materials 110 and 120 through the through-portion 1312. The high temperature side electrode 131 may include a through-portion 1312 that passes through an n type thermoelectric conversion material 110 and a p type thermoelectric conversion material 120 that are adjacent to each other to form a radial thermal gradient in the plurality of thermoelectric conversion materials 110 and 120.

FIG. 3 is a view obtaining by viewing some configurations of the thermoelectric conversion module of FIG. 2 from the front side thereof.

Referring to FIG. 3, the heat fl1 transferred through the thermoelectric portion 1311 of the high temperature side electrode 131 may be transferred to the thermoelectric conversion material 110 through the through-portion 1312. Because the through-parts 1312 are inserted into the center of the thermoelectric conversion materials 110 and 120, the heat transferred to the internal of the thermoelectric conversion material 110 is transferred radially with respect to the through-portion 1312 as in the heat flow F11 of FIG. 3.

Although not illustrated, in another exemplary embodiment of the present invention, the high temperature side electrode 131 may be configured to indirectly receive heat through an exhaust system instead of through a scheme of directly absorbing heat with exhaust gas.

For example, the thermoelectric portion 1311 of the high temperature side electrode 131 may be connected to an external peripheral surface of the high temperature passage pipe 20 to receive heat from the high temperature passage pipe 20. As such, an insulation layer may be provided between the thermoelectric portion 1311 of the high temperature side electrode 131 and the high temperature passage pipe 20 to prevent electrical connection of the thermoelectric portion 1311 and the high temperature passage pipe 20.

The low temperature side electrode 132 may electrically connect an n type thermoelectric conversion material 110 and a p type thermoelectric conversion material 120 that are adjacent to each other and are not connected to each other by the high temperature side electrode 131.

The low temperature side electrode 132 may exchange heat with the low temperature passage pipe 30, through which a refrigerant 31 flows, and may discharge thermal energy in the thermoelectric conversion materials 110 and 120 to the refrigerant 31.

The low temperature side electrode 132 may exchange heat with a cooling jacket 150, and may discharge thermal energy in the thermoelectric conversion materials 110 and 120 to the refrigerant 31 through the cooling jacket 150.

The low temperature side electrode 132 may electrically connect an n type thermoelectric conversion material 110 and a p type thermoelectric conversion material 120 that are adjacent to each other and are not connected to each other by the high temperature side electrode 131. The low temperature side electrode 132 may contact at least three surfaces of the n type thermoelectric conversion material 110 and may contact at least three surfaces of the p type thermoelectric conversion material 120.

Referring to FIG. 2, the low temperature side electrode 132 may include an upper plate 1321 of the low temperature side electrode 132, which covers an upper surface of the thermoelectric conversion material 110 and 120, and a side surface plate 1322 of the low temperature side electrode 132, which covers a side surface of the thermoelectric conversion material 110 and 120. That is, the low temperature side electrode 132 may cover an upper surface, a left surface, a right surface of the plurality of thermoelectric conversion material 110 and 120, through which the high temperature side electrode 131 passes, on which the low temperature side end portion of the low temperature side electrode 132 is located, except for a front surface and a rear surface of the thermoelectric conversion material 110 and 120.

When viewed from the front side, the low temperature side electrode 132 may have a shape corresponding to the thermoelectric conversion material 110 and 120 such that not less than a half of the low temperature side electrode 132 contacts a periphery of the thermoelectric conversion material 110 and 120.

In an exemplary embodiment of the present invention, the plurality of thermoelectric conversion materials 110 and 120 may have a rectangular parallelepiped shape. Accordingly, the low temperature side electrode 132 may have a pi (7c) shape to correspond to the plurality of thermoelectric conversion materials 110 and 120. That is, the low temperature side electrode 132 may include an upper plate 1321 and a pair of side surface plates 1322 to contact an upper surface, a left surface, and a right surface of each of the plurality of thermoelectric conversion materials 110 and 120.

The upper plate 1321 of the low temperature side electrode 132 may cover an upper surface of each of the thermoelectric conversion materials 110 and 120. The upper plate 1321 of the low temperature side electrode 132 may have a specific length and a specific width to cover an upper surface of each of the thermoelectric conversion materials 110 and 120.

The side surface plate 1322 of the low temperature side electrode 132 may cover at least a portion of a side surface of each of the thermoelectric conversion materials 110 and 120. The side plate 1322 of the low temperature side electrode 132 may have a specific length and a specific width to cover a side surface of each of the thermoelectric conversion materials 110 and 120.

Through this, the low temperature side electrode 132 exchanges heat with the plurality of thermoelectric conversion materials 110 and 120 on at least three surfaces thereof, and may cool the plurality of thermoelectric conversion materials 110 and 120.

Furthermore, as compared with the case in which the low temperature side electrode 132 contacts only anyone surface (for example, an upper surface) of the plurality of thermoelectric conversion materials 110 and 120, a coupling area of the low temperature side electrode 132 and the plurality of thermoelectric conversion materials 110 and 120 is large, and as the low temperature side electrode 132 is coupled to the plurality of thermoelectric conversion materials 110 and 120 while having a shape corresponding to the plurality of thermoelectric conversion materials 110 and 120, a coupling force of the low temperature side electrode 132 and the plurality of thermoelectric conversion materials 110 and 120 may be improved. Accordingly, the durability of the thermoelectric conversion module 10 may be improved, and the plurality of thermoelectric conversion materials 110 and 120 and the electrode may be prevented from being separated so that lowering of the power generation performance may be prevented even when the thermoelectric conversion module 10 is used for a long time.

Furthermore, because the lower temperature side electrode 132 has a shape that surrounds the plurality of thermoelectric conversion materials 110 and 120, the plurality of thermoelectric conversion materials 110 and 120 may be effectively protected from an external impact, foreign substances, or the like.

Although not illustrated, in another exemplary embodiment of the present invention, the low temperature side electrode may be of a plate type to contact only the upper surfaces of the thermoelectric conversion materials. In the instant case, as compared with the pi (π) shape, the welding areas of the low temperature side electrode with the thermoelectric conversion materials may be reduced. However, in consideration of a cost performance effect, for example, a case in which electrons or holes in the internals of the thermoelectric conversion materials mainly move to the upper side, the low temperature side electrode may be configured to contact one surface of each of the thermoelectric conversion materials. The low temperature side electrode may have a pi (π) shape, a plate shape, or other shapes in consideration of the internal space and the durability of the thermoelectric conversion module and the properties of the thermoelectric conversion materials.

Referring to FIG. 1, the thermoelectric conversion module 10 may further include insulation layers 140 provided between the plurality of thermoelectric conversion materials and the heat source to insulate the plurality of thermoelectric conversion materials.

The insulation layers 140 may be located between the thermoelectric conversion materials 110 and 120 and the high temperature passage pipe 20 to electrically and thermally insulate the thermoelectric conversion materials 110 and 120. Through this, the thermoelectric conversion materials 110 and 120 are electrically connected to each other only by the electrodes 130, and thermal gradients may be formed in the internals of the thermoelectric conversion materials 110 and 120 by heat exchange of the high temperature side electrode 131 and the low temperature side electrode 132.

Referring to FIG. 1, the thermoelectric conversion module 10 may further include a cooling jacket. To cool the low temperature side electrode, the cooling jacket 150 may contact at least three surfaces of the low temperature side electrode 132.

The cooling jacket 150 may be formed of a thermally conductive material for heat exchange of the low temperature side electrode 132 and the low temperature passage pipe 30.

The cooling jacket 150 may contact the low temperature side electrode 132 on one side thereof, and may contact the low temperature passage pipe 30 on an opposite side thereof.

The cooling jacket 150 may have a shape corresponding to the low temperature side electrode 132 to widen a contact area with the low temperature side electrode 132. That is, the cooling jacket 150 may include an upper plate and side surface plates to correspond to the low temperature side electrode 132 including the upper plate 1321 and the side surface plates 1322.

Referring to FIG. 3, the cooling jacket 150 may have a pi (π) shape to correspond to the low temperature side electrode 132 having a pi (π) shape. Through this, the cooling jacket 150 may effectively receive thermal energy from the low temperature side electrode 132 by widening a contact area with the low temperature side electrode 132.

Furthermore, as compared with the case in which the cooling jacket 150 contacts only any one surface (for example, an upper surface) of the low temperature side electrode 132, the coupling areas of the low temperature side electrode 132 and the plurality of thermoelectric conversion materials 110 and 120 are large, and a coupling force of the low temperature side electrode 132 and the cooling jacket 150 may be improved by coupling the cooling jacket 150 and the low temperature side electrode 132 while the cooling jacket 150 has a shape corresponding to the low temperature side electrode 132. Accordingly, the durability of the thermoelectric conversion module 10 may be improved, and the cooling jacket 150 and the electrode may be prevented from being separated so that lowering of the power generation performance may be prevented even when the thermoelectric conversion module 10 is used for a long time.

Furthermore, because the cooling jacket 150 has a shape that surrounds the low temperature side electrode 132, the low temperature side electrode 132 and the plurality of thermoelectric conversion materials 110 and 120 may be effectively protected from an external impact, foreign substances, or the like.

The thermoelectric conversion module 10 may further include a gasket disposed between the plurality of thermoelectric conversion materials 110 and 120 and the high temperature passage pipe 20 to prevent an internal fluid from being leaked through the through-hole formed in the high temperature passage pipe 20, through which the heat transfer fluid 21 flows.

The gasket may have gasket through-holes, the number of which corresponds to the number of the high temperature side electrodes 131 so that the thermoelectric parts 1311 of the high temperature side electrodes 131 pass through the gasket through-holes. The gasket may have the gasket through-holes that have a shape corresponding to the through-holes of the high temperature passage pipe 20 and are disposed at corresponding locations.

The gasket may be disposed between the insulation layer 140 and the high temperature passage pipe 20. For example, the thermoelectric conversion module 10 may be configured to prevent leakage of the heat transfer fluid 21 from the high temperature passage pipe 20 and insulate the high temperature passage pipe 20 at the same time by disposing glass wool between the gasket and the high temperature passage pipe 20.

The thermoelectric conversion module 10 further include a case 160 that defines an internal space, in which the thermoelectric conversion materials 110 and 120, the plurality of electrodes 130, and the like are accommodated, and protects components of the thermoelectric conversion module 10 from an external impact or foreign substances.

The case 160 may have a rectangular parallelepiped shape in which a surface of the case 160, which faces the high temperature passage pipe 20 is opened.

The thermoelectric conversion materials 110 and 120, the plurality of electrodes 130, the insulation layer 140, and the cooling jacket 150 may be fixed to the internal of the case 160.

The case 160 may be coupled to the high temperature passage pipe 20 and the low temperature passage pipe 30. For example, the case 160 may be blazed to the high temperature passage pipe 20. The internal of the case 160 may be vacuumed or filled with an inert gas.

The thermoelectric conversion module 10 may be electrically connected to a load 170 that consumes electric power generated by the thermoelectric conversion materials 110 and 120. A current I1 generated by the thermoelectric conversion module 10 may flow in the direction indicated in FIG. 1.

Hereinafter, movement of heat and electrons in the internal of the thermoelectric conversion material according to an exemplary embodiment of the present invention will be described with reference to FIG. 3 and FIG. 4.

Referring to FIG. 3, the thermoelectric conversion material 110 may receive thermal energy from the through-portion 1312 of the high temperature side electrode 131, which passes through the center of the thermoelectric conversion material 110. The thermoelectric conversion material 110 and 120 may deliver thermal energy while contacting the low temperature side electrode 132 on the left side, the right side, and the upper side thereof. That is, in the internal of the thermoelectric conversion material 110, heat may be conducted radially as in the heat flow fl1 from a center portion of the thermoelectric conversion material 110, into which the high temperature side electrode 131 is inserted, towards a periphery of the high temperature side electrode 131, which contacts the low temperature side electrode 132.

Referring to FIG. 4, the heat conducted through the thermoelectric portion 1311 of the high temperature side electrode 131 may be transferred to the low temperature side electrode 132 via the through-portion 1312 and the thermoelectric conversion material 110 and 120.

In the n type thermoelectric conversion material 110, electrons may be moved in the movement direction of heat by the Seebeck effect. In the p type thermoelectric conversion material 110, holes having positive charges may be moved in the movement direction of heat. Through this, electrons may be moved as in the electron flow fl2 of FIG. 4.

Figure 5:
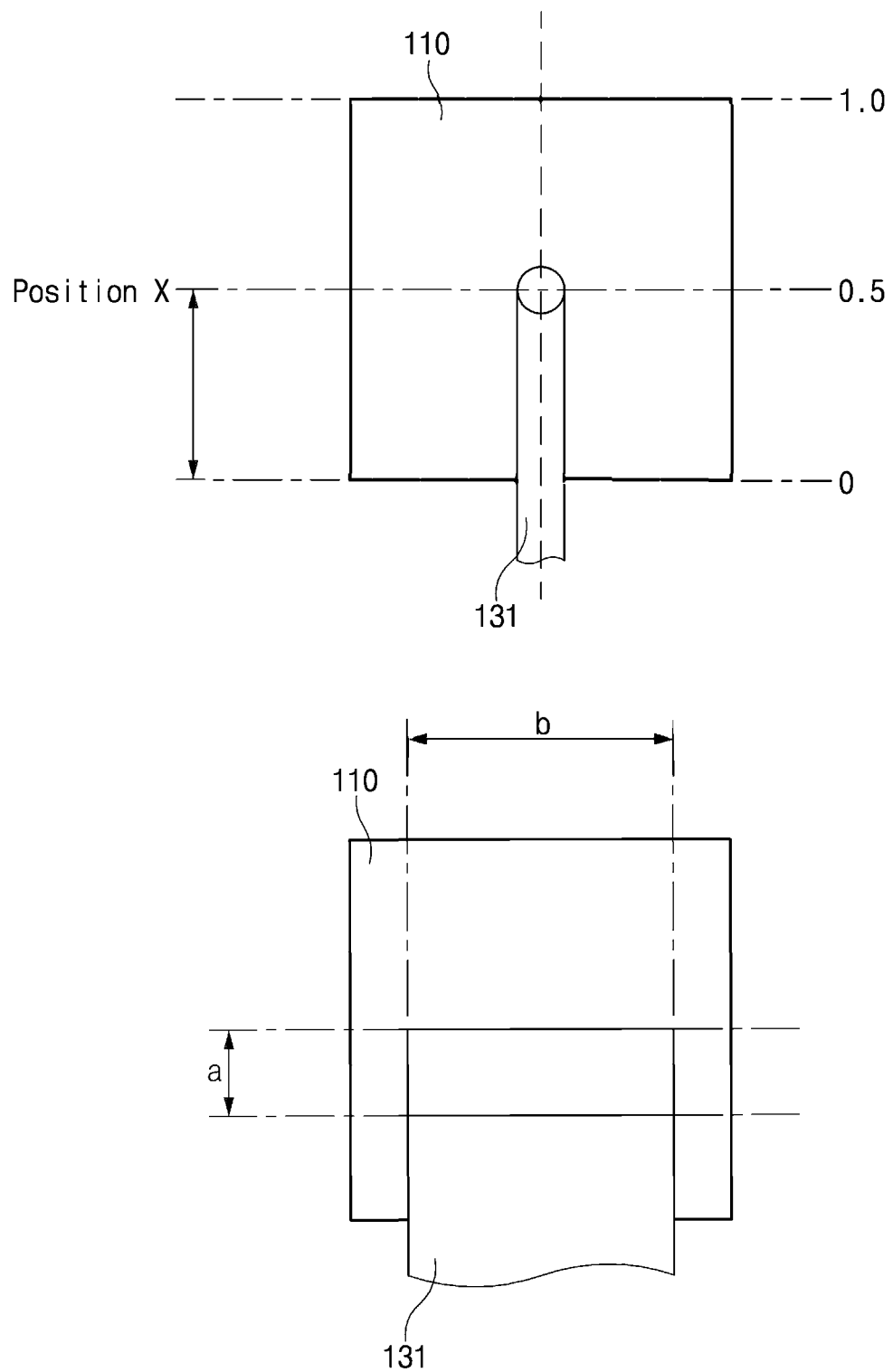
FIG. 5 is a view illustrating an electrode of a thermoelectric conversion module according to exemplary embodiments of the present invention.

FIG. 5 is a view illustrating an electrode of a thermoelectric conversion module according to exemplary embodiments of the present invention.

Referring to FIG. 5, the thermal gradients of the internals of the thermoelectric conversion materials 110 and 120 may be different according to the locations and shapes of the through-parts 1312 of the high temperature side electrodes 131.

To explain the location of the through-portion 1312 of the high temperature side electrode 131 for the thermoelectric conversion material 110 and 120, it is defined that the location of the low temperature side end portion of the thermoelectric conversion material 110 and 120 is x=0 and the location of the high temperature side end portion of the thermoelectric conversion material 110 and 120 is x=1.0.

To explain the shape of the through-portion 1312 of the high temperature side electrode 131, it is defined that the longitudinal length of the through-portion 1312 is a and the transverse length of the through-portion 1312 is b.

The through-portion 1312 of the high temperature side electrode 131 is located at a location of x=5, a thermal gradient is formed radially with respect to the through-portion 1312 and the delivery path of electrons is also formed radially. In the instant case, the movement distance of electrons in the internal of the thermoelectric conversion material 110 and 120 may become shorter than when the location of the through-portion 1312 is x<0.5.

When the through-portion 1312 of the high temperature side electrode 131 is located at a location of x<0.5, the thermal gradient formed in the internal of the thermoelectric conversion material 110 and 120 is formed from the lower side (or the low temperature side end) to the upper side (or the high temperature side end) of the thermoelectric conversion material 110 and 120 and the delivery path of the electrons are also mainly formed from the lower side to the upper side thereof. In the instant case, when the location of the through-portion 1312 is x=0.5, the straightness of the electrons becomes better.

When the cross-section of the through-portion 1312 of the high temperature side electrode 131 is b/a=1, a thermal gradient is formed in the internal of the thermoelectric conversion material 110 and 120 to be close to a shape which is radial with respect to the through-portion 1312 and the delivery path of the electrons also become closer to a radial shape.

When the cross-section of the through-portion 1312 of the high temperature side electrode 131 is b/a>1 or circular, a thermal gradient is formed in the internal of the thermoelectric conversion material 110 and 120 mainly from the lower side to the upper side and the delivery path of the electrons is also formed mainly from the lower side to the upper side thereof.

Accordingly, a distance (x) between the through-portion 1312 of the high temperature side electrode 131 and the high temperature side end portions of the plurality of thermoelectric conversion materials 110 and 120 may be determined based on at least any one of the properties of the plurality of thermoelectric conversion materials 110 and 120 and a calorie obtained from the heat source.

Furthermore, the cross-sectional shape of the through-portion 1312 of the high temperature side electrode 131 may be formed based on at least any one of the properties of the plurality of thermoelectric conversion materials 110 and 120 and a calorie obtained from the heat source. Here, a cross-section may be defined by a cross-section obtained by cutting the through-portion 1312 of the high temperature side electrode 131 in a direction (i.e., a vertical direction) which is perpendicular to a direction (i.e., a forward/rearward direction) along which the through-portion 1312 of the high temperature side electrode 131 extends.

For example, the through-portion 1312 of the high temperature side electrode 131 may be provided to be closer to the centers of the plurality of thermoelectric conversion materials 110 and 120 than to the high temperature side end portions or the low temperature side end portions of the plurality of thermoelectric conversion materials 110 and 120 to minimize a movement distance of electrons in the internals of the plurality of thermoelectric conversion materials 110 and 120 when a specific resistance of the thermoelectric conversion materials is high. That is, the through-portion 1312 of the high temperature side electrode 131 may be located to be close to a location of x=0/5.

For example, the through-portion 1312 of the high temperature side electrode 131 may be provided to be closer to the high temperature side end portions of the plurality of thermoelectric conversion materials 110 and 120 than to the low temperature side end portions of the plurality of thermoelectric conversion materials 110 and 120 such that the delivery path of the electrons may be formed vertically in the internals of the plurality of thermoelectric conversion materials 110 and 120 when a specific resistance of the thermoelectric conversion materials is low. That is, the through-portion 1312 of the high temperature side electrode 131 may be located at a location of x<0/5.

For example, the through-portion 1312 of the high temperature side electrode 131 may be located at or to be closer to a location of x=0.5 when a calorie which may be provided from the heat source (exhaust gas in an exemplary embodiment of the present invention) is sufficient.

For example, the through-portion 1312 of the high temperature side electrode 131 may be provided to be closer to the low temperature side end portions of the plurality of thermoelectric conversion materials 110 and 120 than to the high temperature side end portions of the plurality of thermoelectric conversion materials 110 and 120 to minimize the heat which is lost before the heat obtained from the heat source by the high temperature side electrode 131 is transferred to the plurality of thermoelectric conversion materials 110 and 120 when a calorie which may be provided from the heat source is not sufficient. That is, a distance by which the heat absorbed from the heat source (exhaust gas) is conducted until the heat is transferred to the thermoelectric conversion materials 110 and 120 may be reduced to reduce the heat which is lost while the heat is conducted along the thermoelectric portion 1311 of the high temperature side electrode 131.

The through-portion 1312 of the high temperature side electrode 131 may be formed such that a ratio (b/a) of the longitudinal length (a) to the transverse length (b) of the cross-section is 0.8 to 1.2 to form a radial thermal gradient in the internals of the plurality of thermoelectric conversion materials 110 and 120.

For example, the through-portion 1312 of the high temperature side electrode 131 may be formed such that a ratio (b/a) of the longitudinal length (a) to the transverse length (b) of the cross-section is 0.8 to 1.2 when it is closer to the centers of the plurality of thermoelectric conversion materials 110 and 120 than to the high temperature side end portions or the low temperature side end portions of the plurality of thermoelectric conversion materials 110 and 120.

The through-portion 1312 of the high temperature side electrode 131 may be formed such that a ratio (b/a) of the longitudinal length (a) to the transverse length (b) of the cross-section is 2 to 1.2 to form a thermal gradient of the high temperature side end portions to the low temperature side end portions of the plurality of thermoelectric conversion materials 110 and 120 in the internals of the plurality of thermoelectric conversion materials 110 and 120.

For example, the through-portion 1312 of the high temperature side electrode 131 may be formed such that a ratio (b/a) of the longitudinal length (a) to the transverse length (b) of the cross-section is not less than 2 when it is provided to be closer to the low temperature side end portions of the plurality of thermoelectric conversion materials 110 and 120 than to the high temperature side end portions of the plurality of thermoelectric conversion materials 110 and 120.

The above-configured thermoelectric conversion module may solve a conventional durability problem of easily separating an interface between a thermoelectric conversion material and an electrode by providing an electrode that passes through a thermoelectric conversion material.

Furthermore, the present invention may improve the power generation performance of the thermoelectric conversion module while minimizing lost heat by properly forming the locations and shapes of the electrodes that pass through the thermoelectric conversion materials in consideration of the properties of the thermoelectric conversion materials and the calorie of the heat source.

Furthermore, the present invention may improve the power generation performance of the thermoelectric conversion module by allowing the high temperature side electrode to receive heat of high temperature from the heat source (e.g., exhaust gas) while directly contacting the heat source to transfer the heat to the heat conversion materials, increasing the temperature difference between the high temperature sides and the low temperature sides of the thermoelectric conversion materials.

Furthermore, the present invention may improve the coupling forces of the low temperature side electrode, the cooling jacket, and the thermoelectric conversion material, resulting in improvement of the durability of the thermoelectric conversion module by forming the low temperature side electrode and the cooling jacket that correspond to the thermoelectric conversion materials such that at least a portion of the thermoelectric conversion materials may be accommodated in the internal space.

Figure 6:
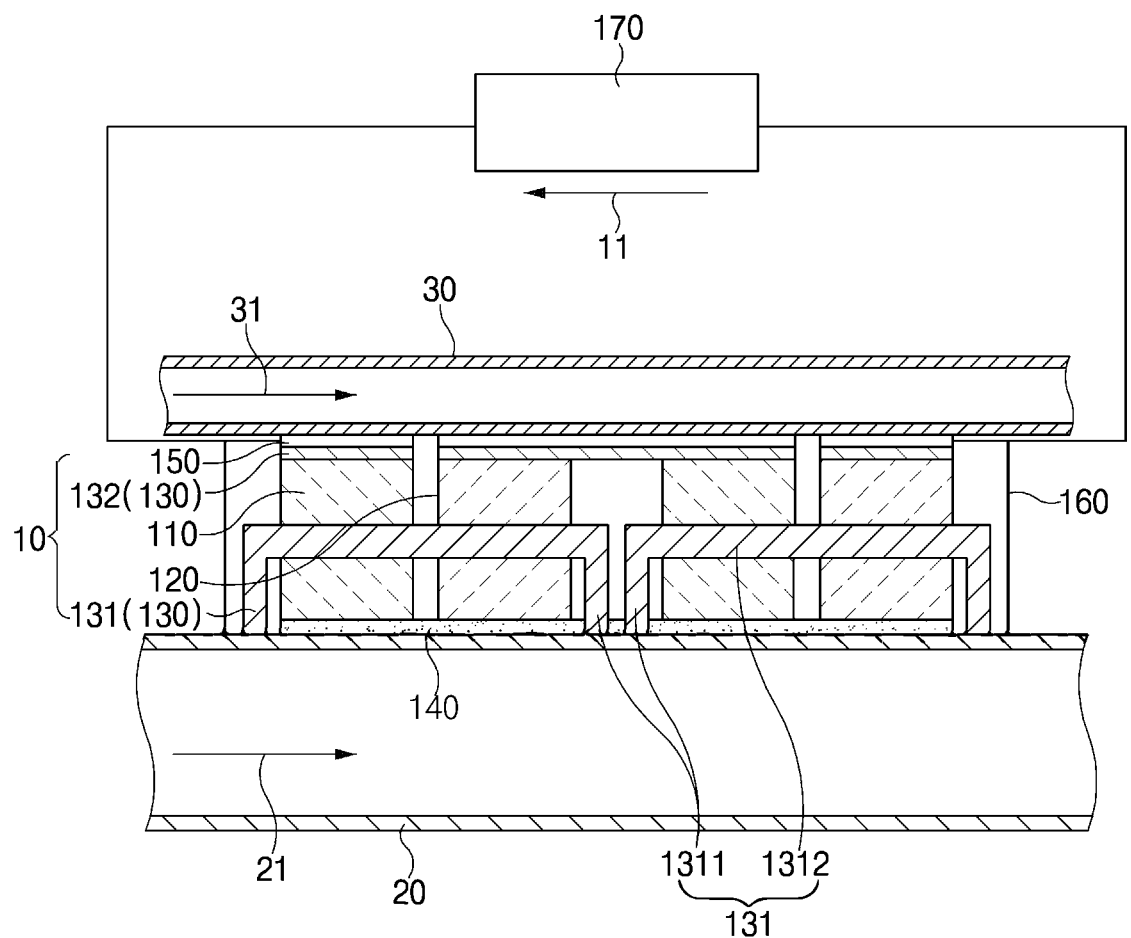
FIG. 6 is a conceptual view illustrating a thermoelectric conversion module according to another exemplary embodiment of the present invention.

FIG. 6 is a conceptual view illustrating a thermoelectric conversion module according to another exemplary embodiment of the present invention.

Referring to FIG. 6, unlike the above-mentioned embodiment, in another exemplary embodiment of the present invention, the high temperature side electrode 131 may have a shape that does not pass through the high temperature passage pipe 20.

In the instant case, the thermoelectric parts 1311 of the high temperature side electrode 131 extend from opposite end portions of the through-portion 1312 toward the high temperature passage pipe 20, and may be configured to directly or indirectly contact the high passage pipe 20.

An insulation layer may be provided between one end portion of the thermoelectric portion 1311 and the high temperature passage pipe 20 to restrict an electric current from flowing through the high temperature passage pipe 20. However, the insulation layer allow heat to be transferred from the high temperature passage pipe 20 to the high temperature side electrode 131 well.

A portion of the thermoelectric portion 1311, which contacts the high temperature passage pipe 20, may make a contact surface with the high temperature passage pipe 20 wider.

For example, the thermoelectric portion 1311 may be shaped such that an end portion of the thermoelectric portion 1311, which is close to the high temperature passage pipe 20, spread out along an external peripheral surface of the high temperature passage pipe 20.

Because the thermoelectric conversion module configured in the instant way is not inserted through the high temperature passage pipe, the fluid in the internal of the high temperature passage pipe may be prevented from being leaked and the thermoelectric conversion module may be conveniently disposed.

According to an exemplary embodiment of the present invention, because the electrodes transfer heat while passing through the thermoelectric conversion materials and being electrically connected to the thermoelectric conversion materials, the coupling forces of the electrodes and the thermoelectric conversion materials may be improved and through this, the durability of the thermoelectric conversion module may be improved.

Furthermore, because the electrodes transfer heat while passing through central parts of the thermoelectric conversion materials and radial thermal gradients are formed in the internals of the thermoelectric conversion materials, the movement distances of the electrons in the internals of the thermoelectric conversion materials may be reduced and the power generation performance may be improved.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A thermoelectric conversion module comprising:
a plurality of n type thermoelectric conversion materials and a plurality of p type thermoelectric conversion materials that are disposed alternately; and
a plurality of electrodes configured to connect the plurality of thermoelectric conversion materials disposed alternately at low temperature side end portions and a central portion of the plurality of thermoelectric conversion materials alternately, and
wherein the plurality of electrodes includes:
a first electrode configured to penetrate a central portion of an n type thermoelectric conversion material and a central portion of a p type thermoelectric conversion material that are adjacent to each other to form a radial thermal gradient in the plurality of thermoelectric conversion materials by transferring heat obtained from a heat source to the plurality of thermoelectric conversion materials, and
wherein the first electrode is further configured to protrude towards a pipe, through which a heat transfer fluid flows, with respect to high temperature side end portions of the plurality of thermoelectric conversion materials such that the first electrode is inserted into a through-hole formed at the pipe to obtain the heat while directly contacting with the heat transfer fluid and to transfer the obtained heat to the plurality of thermoelectric conversion materials.

2. A vehicle comprising:
a thermoelectric conversion module disposed in an exhaust pipe, through which exhaust gas flows, to generate electric power by use of heat of the exhaust gas,
wherein the thermoelectric conversion module includes:
a plurality of n type thermoelectric conversion materials and a plurality of p type thermoelectric conversion materials that are disposed alternately; and
a plurality of electrodes configured to connect the plurality of thermoelectric conversion materials disposed alternately on high temperature end portions and low temperature end portions of the plurality of thermoelectric conversion materials alternately,
wherein the plurality of electrodes includes:
a first electrode configured to electrically connect the n type thermoelectric conversion material and the p type thermoelectric conversion material by penetrating the n type thermoelectric conversion material and the p type thermoelectric conversion material to transfer heat obtained from a heat source to the plurality of thermoelectric conversion materials, and
wherein the first electrode is further configured to protrude toward the exhaust pipe with respect to the high temperature side end portions of the plurality of thermoelectric conversion materials such that the first electrode is inserted into a through-hole formed at the exhaust pipe to obtain the heat while directly contacting with the exhaust gas and to transfer the obtained heat to the plurality of thermoelectric conversion materials.

* * * * *